US008105962B2

(12) United States Patent
Frohberg et al.

(10) Patent No.: US 8,105,962 B2
(45) Date of Patent: Jan. 31, 2012

(54) METHOD AND A SEMICONDUCTOR DEVICE COMPRISING A PROTECTION LAYER FOR REDUCING STRESS RELAXATION IN A DUAL STRESS LINER APPROACH

(75) Inventors: Kai Frohberg, Niederau (DE); Frank Feustel, Dresden (DE); Thomas Werner, Reichenberg (DE); Uwe Griebenow, Markkleeberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 170 days.

(21) Appl. No.: 12/131,429

(22) Filed: Jun. 2, 2008

(65) Prior Publication Data

US 2009/0140348 A1 Jun. 4, 2009

(30) Foreign Application Priority Data

Nov. 30, 2007 (DE) .......................... 10 2007 057 686

(51) Int. Cl.
*H01L 21/31* (2006.01)
(52) U.S. Cl. ........................ 438/783; 438/622
(58) Field of Classification Search .................. 257/369, 257/395, E29.169, 912; 438/197, 199, 287, 438/294, FOR. 221, 622, 783
See application file for complete search history.

(56) References Cited

U.S. PATENT DOCUMENTS

| 5,783,481 | A | 7/1998 | Brennan et al. ............... 438/623 |
| 6,103,616 | A * | 8/2000 | Yu et al. ......................... 438/622 |
| 2002/0056838 | A1* | 5/2002 | Ogawa .............................. 257/59 |
| 2006/0131672 | A1* | 6/2006 | Wang et al. ..................... 257/410 |
| 2007/0108525 | A1 | 5/2007 | Yang et al. ...................... 257/351 |
| 2007/0235823 | A1* | 10/2007 | Hsu et al. ........................ 257/411 |
| 2008/0258227 | A1* | 10/2008 | Wang et al. ..................... 257/369 |

FOREIGN PATENT DOCUMENTS

| DE | 10 2004 052 578 A1 | 5/2006 |
| DE | 10 2004 031 744 A1 | 7/2006 |
| DE | 10 2006 040 762 A1 | 3/2008 |

OTHER PUBLICATIONS

S.M. Sze "Semiconductor Devices. Physics and Technology. 2nd Edition", (C) 2002 John Wiley and Sons, pp. 379, 434.*
"Handbook of Multilevel Metallization for Integrated Circuits—Materials, Technology and Applications", ed. by S.R. Wilson et al., (C) 1993 William Andrew Publishing/Noyes, p. 283.*
Translation of Official Communication from German Patent Office for German Patent Application No. 10 2007 057 686.4-33 dated Aug. 13, 2008.

* cited by examiner

*Primary Examiner* — N Drew Richards
*Assistant Examiner* — Yu-Hsi D Sun
(74) *Attorney, Agent, or Firm* — Williams, Morgan & Amerson, P.C.

(57) ABSTRACT

By providing a protection layer for suppressing stress relaxation in a tensile-stressed dielectric material during a dual stress liner approach, performance of N-channel transistors may be increased, while nevertheless maintaining a high degree of compatibility with conventional dual stress liner approaches.

7 Claims, 10 Drawing Sheets

METHOD AND A SEMICONDUCTOR DEVICE COMPRISING A PROTECTION LAYER FOR REDUCING STRESS RELAXATION IN A DUAL STRESS LINER APPROACH

BACKGROUND OF THE INVENTION

1. Field of the Invention

Generally, the present disclosure relates to the field of integrated circuits, and, more particularly, to the manufacture of N-channel field effect transistors having a strained channel region caused by a stressed dielectric material formed above the transistor.

2. Description of the Related Art

Integrated circuits typically comprise a large number of circuit elements on a given chip area according to a specified circuit layout, wherein, in complex circuits, the field effect transistor represents one important device component. Generally, a plurality of process technologies are currently practiced, wherein, for complex circuitry based on field effect transistors, such as microprocessors, storage chips and the like, MOS technology is currently one of the most promising approaches due to the superior characteristics in view of operating speed and/or power consumption and/or cost efficiency. During the fabrication of complex integrated circuits using MOS technology, millions of transistors, in CMOS technology, complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region represents an important factor that substantially affects the performance of MOS transistors. Thus, the reduction of the channel length, and associated therewith the reduction of the channel resistivity, may be dominant design criteria for accomplishing an increase in the operating speed of integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the reduction of the thickness of the gate dielectric layer in order to maintain the desired channel controllability on the basis of increased capacitive coupling. With the thickness of oxide-based gate dielectrics approaching 1.5 nm and less, the further scaling of the channel length may be difficult due to an unacceptable increase of leakage currents through the gate dielectric. For this reason, it has been proposed to enhance device performance of the transistor elements not only by reducing the transistor dimensions but also by increasing the charge carrier mobility in the channel region for a given channel length. One efficient approach in this respect is the modification of the lattice structure in the channel region, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer in or near the channel region to create tensile or compressive stress. Although the transistor performance may be considerably enhanced by the introduction of strain-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by modifying the stress characteristics of a material that is closely positioned to the transistor structure in order to allow an efficient stress transfer to the channel region. For example, the spacer typically provided at sidewalls of the gate electrodes and the contact etch stop layer that is formed above the basic transistor structure are promising candidates for creating external stress which may then be transferred into the transistor. The contact etch stop layer is, therefore, frequently used since it may be required anyway for controlling an etch process designed to form contact openings to the gate, drain and source terminals in an interlayer dielectric material. The effective control of mechanical stress in the channel region, i.e., an effective stress engineering, may be accomplished for different types of transistors by individually adjusting the internal stress in the contact etch stop layers located above the respective transistor elements to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher compressive stress, while stress levels of 1 GPa and higher may be obtained for tensile-stressed silicon nitride materials, wherein the type and the magnitude of the intrinsic stress may be efficiently adjusted by selecting appropriate deposition parameters. For example, ion bombardment, deposition pressure, substrate temperature, the type of gas components and the like represent suitable parameters that may be used for obtaining the desired intrinsic stress. As explained before, the contact etch stop layer is positioned close to the transistor so that the intrinsic stress may be efficiently transferred into the channel region, thereby significantly improving the performance thereof. Moreover, for advanced applications, the strain-inducing contact etch stop layer may be efficiently combined with other strain-inducing mechanisms, such as strained or relaxed semiconductor materials that are incorporated at appropriate transistor areas in order to also create a desired strain in the channel region. Consequently, the stressed contact etch stop layer is a well-established design feature for advanced semiconductor devices.

However, in actual integration schemes for selectively providing a tensile-stressed dielectric material and a compressively-stressed dielectric material above respective transistor elements, it may be observed that, in particular, the performance of N-channel transistors may not be enhanced as efficiently as expected. With reference to FIGS. 1a-1d, a corresponding integration scheme may be described in which a tensile-stressed dielectric material may be deposited first, thereby resulting in a less pronounced performance gain for N-channel transistors.

FIG. 1a schematically illustrates a cross-sectional view of a semiconductor device 100 comprising a substrate 101, such as a silicon substrate and the like, above which is formed a silicon semiconductor layer 102. In and above the semiconductor layer 102, an N-channel transistor 150A and a P-channel transistor 150B may be formed. The transistors 150A, 150B may differ in other aspects of their device configuration in addition to their conductivity type, depending on the overall device requirements. The transistors 150A, 150B may represent a complementary transistor pair or may represent transistor elements which may be located at specific device regions. Although the transistors 150A, 150B may differ in their configuration, for convenience, any such differences are not shown in FIG. 1a. Thus, the transistors 150A, 150B may comprise a gate electrode 151, which may be comprised of polysilicon and the like, depending on the device requirements. Furthermore, a gate insulation layer 152 separates the gate electrode 151 from a channel region 153 which in turn is laterally bordered by drain and source regions 154. Furthermore, metal silicide regions 155 may be provided in the drain and source regions 154 and in the gate electrode 151. As shown, the gate electrode structure may have formed on sidewalls thereof a spacer structure 156, which may be comprised of a plurality of individual spacer elements, possibly in combination with appropriate liner materials, according to well-established spacer concepts. In the manufacturing stage shown in FIG. 1a, the device 100 may further comprise an etch stop layer 103 comprised of, for instance, silicon dioxide, followed by a tensile-stressed contact etch stop layer 110, formed of the silicon nitride having a high intrinsic tensile stress. Moreover, an etch control layer 104, for instance, in the form of silicon dioxide, is formed on the stressed contact etch stop layer 110. Thus, the internal stress of the layer 110 is selected to enhance performance of the N-channel transistor 150A, as previously explained.

Typically, the device 100 as shown may be formed on the basis of the following processes. After patterning the gate electrode structure 151 and the gate insulation layer 152, the drain and source regions 154 may be defined, for instance, on the basis of the spacer structure 156, wherein respective individual spacer elements may be provided to act as an efficient implantation mask, depending on the desired lateral and vertical dopant profile for the drain and source regions 154. The dopant within the drain and source regions 154 and implantation-induced damage may be annealed, resulting in activated dopants and a re-crystallized lattice in the drain and source regions 154. Thereafter, the metal silicide regions 155 may be formed on the basis of well-established techniques, for instance, including the deposition of an appropriate refractory metal followed by a heat treatment for initiating a chemical reaction. After removal of any non-reactive metal material, the etch stop layer 103 may be deposited, for instance, by PECVD in the form of silicon dioxide having a desired density and thickness as may be desired for a subsequent usage as an etch stop layer, when patterning the contact etch stop layer 110. Next, the layer 110 may be deposited on the basis of appropriately selected deposition parameters, as previously explained, in order to deposit silicon nitride material with reduced density, and thus a high internal tensile stress, as may be desired for performance enhancement of the transistor 150A. For instance, during the deposition process, in particular, the degree of ion bombardment may be efficiently used for controlling the magnitude and type of internal stress. Thereafter, the etch control layer 104, for instance, in the form of a silicon dioxide material which may have a reduced density, depending on the deposition parameters, is formed, possibly in an in situ process with respect to the layer 110.

FIG. 1b schematically illustrates the semiconductor device 100 during an etch process 105 which is performed on the basis of a resist mask 106 that covers the N-channel transistor 150A. The resist mask 106 may be formed on the basis of well-established photolithography techniques, while, for the etch process 105, a plurality of appropriate etch recipes are available. For instance, the etch control layer 104 may be removed on the basis of any appropriate etch chemistry for etching silicon dioxide material, for instance, in the form of a dry or wet chemical etch step. Thereafter, well-established plasma-assisted etch recipes may be used for etching the exposed portion of the layer 110 selectively to the etch stop layer 103. For instance, respective etch techniques are well established from conventional spacer techniques and may also be used in this case. The etch stop layer 103 may thus reliably protect sensitive device areas, such as the metal silicide regions 155 in the transistor 150B. Depending on the overall process strategy, the layer 103 may be removed from above the transistor 150B, however, on the basis of a less aggressive etch recipe, thereby not unduly affecting the metal silicide regions 155.

FIG. 1c schematically illustrates the semiconductor device 100 in a further advanced manufacturing stage in which a compressively stressed contact etch stop layer 120 is formed above the transistors 150A, 150B. Additionally, a resist mask 107 protects the transistor 150B during an etch process 108 designed to remove the exposed portion of the compressively stressed layer 120 above the N-channel transistor 150A. The etch process 108 may be carried out on the basis of the etch control layer 104, which may create an appropriate endpoint detection signal, that is, an appropriate spectral intensity of radiation of the gaseous ambient created during the etch process 108, when the etch front encounters the etch control layer 104. After removing the exposed portion of the compressively-stressed layer 120 and any residues of the etch control layer 104, the further processing may be continued by depositing an interlayer dielectric material. For this purpose, well-established PECVD techniques on the basis of TEOS (tetra ethyl orthosilicate) are used to provide silicon dioxide material at a high deposition rate with desired chemical and mechanical characteristics. Thus, the transistors 150A, 150B may be enclosed by the silicon dioxide-based material, the surface topography of which may be planarized, for instance, by chemical mechanical polishing (CMP) in which the high-mechanical integrity of the silicon dioxide material may result in higher process robustness.

FIG. 1d schematically illustrates the semiconductor device 100 after finishing the above-described process sequence. Hence, the device 100 comprises a silicon dioxide material 109 acting as an interlayer dielectric material and having a substantially planar surface configuration. Thereafter, a respective photolithography process may be performed in order to create an etch mask for patterning the interlayer dielectric material 109 to thereby produce respective openings 109A, which are illustrated in dashed lines, and in which finally a metal material is to be deposited. During a corresponding patterning process, the contact etch stop layers 120, 110 may be used as etch stop materials, which may be opened in a separate etch step so as to finally connect to the drain and source regions 154 and to the gate electrodes 151.

During operation of the semiconductor device 100, performance of the transistor 150B may be significantly enhanced due to the high compressive stress which generates a respective compressive strain in the channel region of this transistor. Similarly, performance of the transistor 150A may be enhanced, however, at a significantly lower degree compared to what would be expected on the basis of the initially created tensile strain of the layer 110. Thus, although the dual stress liner approach described above is well established and provides various advantages compared to other strain-inducing mechanisms, performance enhancement, in particular for N-channel transistors, may not be fully exploited by the conventional strategies.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which the stress transfer mechanism of a tensile-stressed dielectric material may be enhanced by substantially avoiding or at least significantly reducing the undesired incorporation of material during plasma-based deposition processes, such as plasma enhanced chemical vapor deposition, which may result in a non-desired relaxation of the internal tensile stress. Consequently, the initially generated internal tensile stress may be conserved to a high degree, even after the deposition of an interlayer dielectric material, which may be accomplished on the basis of plasma enhanced deposition techniques, which provide the desired mechanical and chemical characteristics of the interlayer dielectric material, while also providing enhanced process throughput. Based on the principles disclosed herein, therefore, a high degree of compatibility with conventional stressed liner approaches may be maintained while nevertheless enhancing the stress transfer mechanism, in particular for N-channel transistors.

One illustrative method disclosed herein comprises forming a first stress-inducing dielectric layer above a P-channel transistor and an N-channel transistor. The method further comprises selectively removing a portion of the first stress-inducing layer from above the P-channel transistor and forming a second stress-inducing dielectric layer above the P-channel transistor and the N-channel transistor. The method further comprises selectively removing a portion of the second stress-inducing layer from above the N-channel transistor and forming a dielectric buffer layer above the first and second dielectric stress-inducing layers by a non-plasma assisted deposition process. Finally, an interlayer dielectric material is deposited by performing a plasma enhanced chemical vapor deposition process.

A further illustrative method disclosed herein comprises forming a tensile-stressed dielectric layer above an N-channel transistor and forming a dielectric buffer material on the tensile-stressed dielectric layer by performing a deposition process without using a plasma ambient. The method further comprises depositing an interlayer dielectric material above the dielectric buffer material by using a plasma assisted deposition process.

One illustrative semiconductor device disclosed herein comprises a first transistor and a second transistor above a substrate. Furthermore, the semiconductor device comprises a first stress-inducing dielectric layer formed above the first transistor and inducing a first type of strain in the channel region of the first transistor. Furthermore, a second stress-inducing dielectric layer is formed above the second transistor and induces a second type of strain in the channel region of the second transistor. Furthermore, the semiconductor device comprises a polymer material formed above the first and second stress-inducing layers and a silicon dioxide-based interlayer dielectric material formed above the polymer material.

BRIEF DESCRIPTION OF THE DRAWINGS

The disclosure may be understood by reference to the following description taken in conjunction with the accompanying drawings, in which like reference numerals identify like elements, and in which.

Figure 1A:
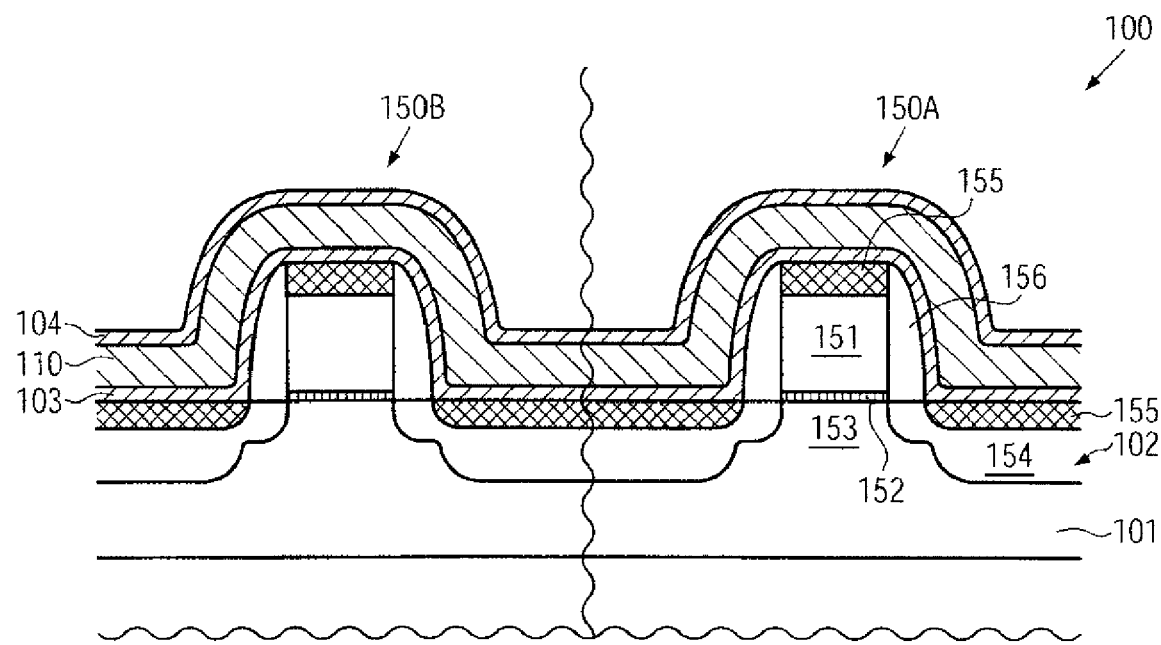
FIGS. 1a-1d schematically illustrate cross-sectional views of a conventional semiconductor device during various manufacturing stages in forming a tensile-stressed dielectric material and a compressively-stressed dielectric material according to a well-established dual stress liner approach.
Figure 1B:
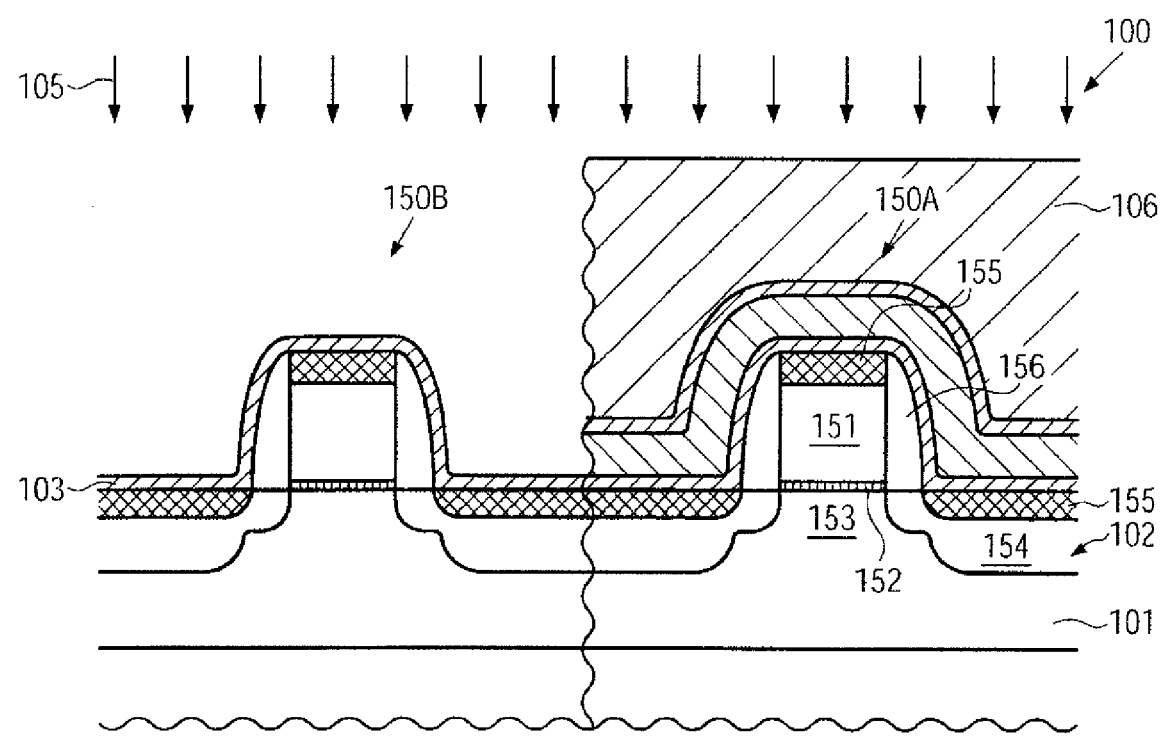
Figure 1C:
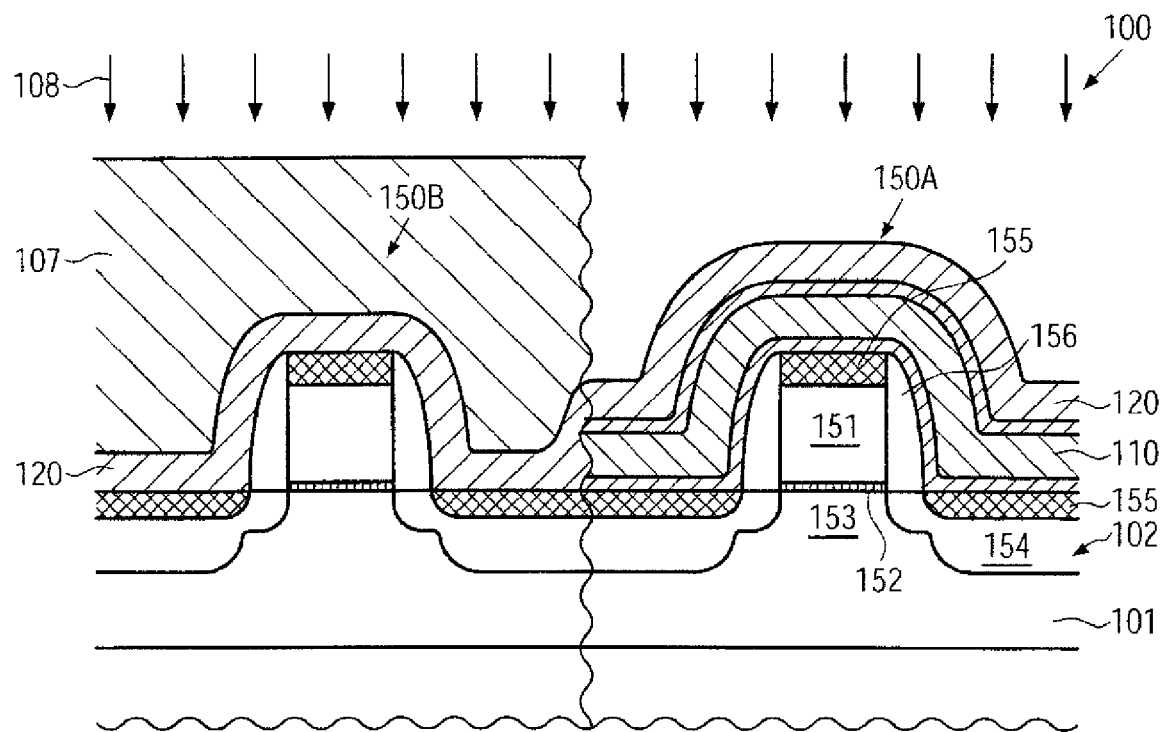
Figure 1D:
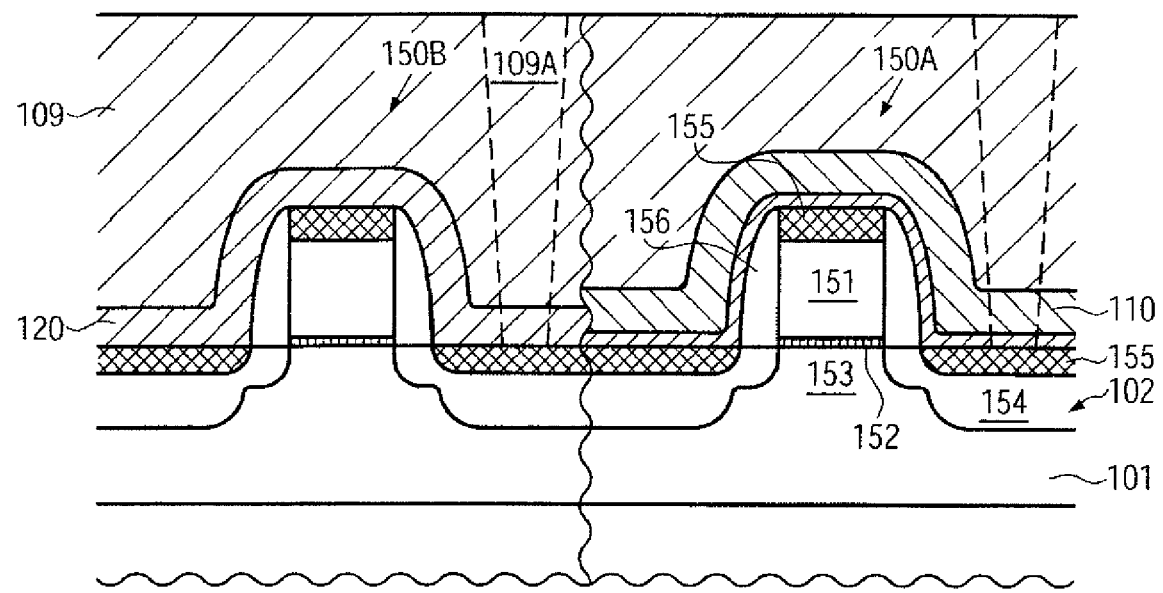

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the subject matter disclosed herein relates to a technique and respective semiconductor devices in which a strain-inducing mechanism is provided on the basis of stressed dielectric materials formed above respective transistor elements, wherein the efficiency of at least the tensile-stressed material may be enhanced by appropriately protecting the sensitive tensile-stressed dielectric material prior to performing a plasma assisted deposition process. As will be explained later on with reference to FIG. 2a, it is believed that the density of a tensile-stressed dielectric material, such as silicon nitride, may be significantly altered during an aggressive deposition process, as is typically used for the deposition of an interlayer dielectric material on the basis of TEOS, which may result in the incorporation of material, thereby increasingly densifying the tensile-stressed dielectric material. Consequently, by providing an appropriate protection layer for substantially avoiding or at least greatly reducing strain relaxation during a plasma assisted deposition process, the initially created tensile stress may be preserved, at least at a higher degree compared to conventional strategies, thereby obtaining enhanced performance of N-channel transistors or any other transistor devices requiring a tensile-strained channel region. As will be explained later on in more detail, the principles disclosed herein may be combined with conventional dual stress liner approaches, i.e., with techniques for depositing and patterning differently stressed dielectric materials to obtain a substantially continuous layer having a different type of intrinsic stress above different types of transistors. Consequently, well-established process techniques may further be used while nevertheless significantly enhancing the overall stress transfer mechanism.

For example, respective patterning regimes as previously discussed with reference to FIGS. 1a-1d may be maintained with a high degree of compatibility, while, in other illustrative embodiments disclosed herein, the compressively stressed dielectric material may be formed first while efficient buffer materials may be provided to substantially maintain the high internal tensile stress of the subsequently deposited dielectric material. The buffer material for reducing stress relaxation may be formed on the basis of a non-plasma assisted process, thereby effectively avoiding or suppressing non-desired particle bombardment and thus stress relaxation in the underlying tensile-stressed material. In some illustrative embodiments, the non-plasma assisted deposition process may comprise a thermally activated chemical vapor deposition (CVD) process, for instance on the basis of TEOS for forming silicon dioxide material, while also other appropriate thermally activated CVD techniques may be used. In other illustrative examples, spin coating techniques may be used in order to provide an appropriate material, such as a polymer material, which may act as an efficient buffer for a subsequent plasma enhanced deposition of, for instance, silicon dioxide.

Figure 2A:
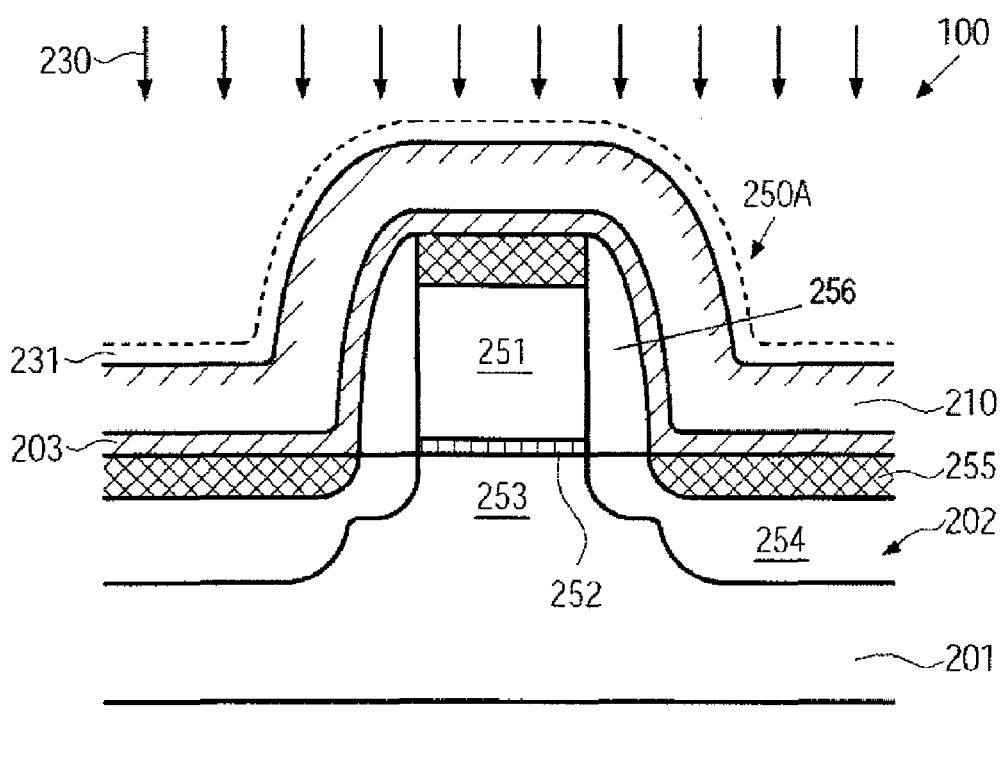
FIG. 2a schematically illustrates an N-channel transistor with a tensile-stressed dielectric material, the internal stress of which may be relaxed on the basis of particle bombardment during the deposition of an interlayer dielectric material, which is considered as a performance reducing mechanism.

FIG. 2a schematically illustrates a cross-sectional view of an N-channel transistor 250A which may comprise a substrate 201 having formed thereabove a silicon-based semiconductor layer 202. The semiconductor layer 202 and the substrate 201 may define a "bulk" configuration in which the semiconductor layer 202 may represent an upper portion of the substantially crystalline substrate 201, while, in other cases, a silicon-on-insulator (SOI) configuration may be formed by the layer 202 and the substrate 201, when the substrate 201 comprises thereon an insulating buried material (not shown). In other cases, respective SOI areas and bulk areas may be provided on the same substrate 201 at different device regions, such as RAM areas, CPU cores and the like. The N-channel transistor 250A may comprise substantially the same configuration as previously described with reference to the transistor 150A. Hence, the transistor 250A may comprise a gate electrode structure 251, a gate insulation layer 252, a channel region 253, drain and source regions 254, metal silicide regions 255 and a sidewall spacer structure 256. With respect to respective characteristics of these components, as well as in view of manufacturing techniques for forming the same, substantially the same criteria apply as previously explained with reference to the device 150A. Furthermore, as shown, the transistor 250A may comprise an etch stop layer 203, for instance, in the form of a silicon dioxide layer, followed by a tensile-stressed dielectric layer 210, for instance, comprised of silicon nitride. The etch stop layer 203 and the tensile-stressed dielectric layer 210 may be formed on the basis of process techniques as previously described with reference to the layers 103 and 110. Furthermore, the layer 210 may be exposed to a plasma assisted ambient 230, as may typically be used for the deposition of material such as silicon dioxide, with moderately high deposition rate, which is typically desired for forming silicon dioxide-based interlayer dielectric materials. Thus, during the plasma assisted process 230, an initial material layer 231 may have been deposited on the basis of a moderately high particle bombardment, which may also result in a significant material incorporation into the layer 210, due to the reduced density of the material of the layer 210. For instance, during a plasma enhanced deposition process based on deposition parameters selected such that a very high tensile stress may be created in a silicon nitride material, the material as deposited may be relatively soft and porous, which may result in "efficient" material incorporation when exposed to the plasma assisted deposition ambient 230. Due to the material incorporation into the structure, a significant portion of the layer 210 may be modified, i.e., may be relaxed, thereby also reducing the overall internal stress, which may finally act on the channel region 253. Consequently, according to the principles disclosed herein, prior to actually establishing the plasma assisted deposition ambient 230, an appropriate buffer material, i.e., a protection layer for reducing or substantially avoiding stress relaxation, may be formed on the basis of a deposition technique that does not require a plasma assisted ambient, thereby reducing enhanced particle incorporation into the sensitive surface area of the layer 210.

Figure 2B:
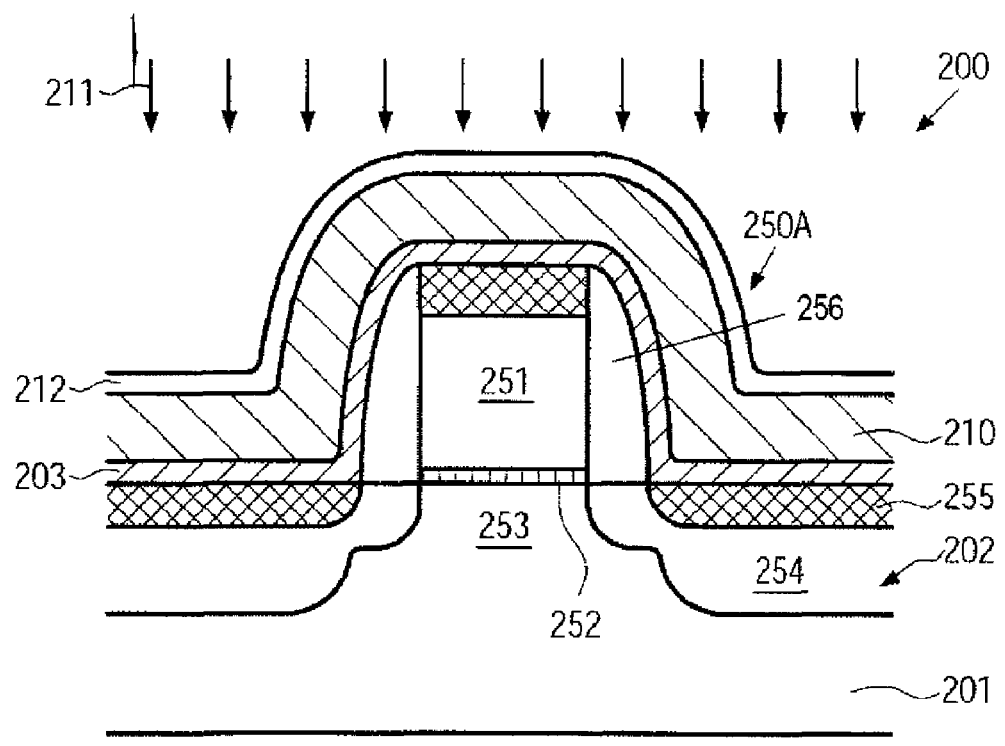
FIGS. 2b-2c schematically illustrate an N-channel transistor during various manufacturing stages in forming a highly tensile-stressed dielectric material in combination with an appropriate buffer material formed without using plasma assisted deposition techniques, according to illustrative embodiments.

FIG. 2b schematically illustrates the transistor 250A prior to establishing the ambient 230 for depositing an interlayer dielectric material. As shown, the transistor 250A is exposed to a deposition ambient 211, without requiring a deposition plasma, in order to form a buffer material 212, for instance in the form of silicon dioxide, silicon oxynitride, silicon nitride, polymer materials and the like. In the illustrative embodiment shown in FIG. 2b, the non-plasma assisted deposition process 211 may comprise a thermally activated CVD process, for instance, on the basis of any appropriate precursor material and a process temperature that is compatible with the manufacturing stage of the transistor 250A. In one illustrative embodiment, the buffer material 212 may be formed by a thermal CVD process using TEOS as precursor material, thereby providing a deposition process having superior gap-filling capabilities, if required, wherein a high degree of conformality may also be obtained. In some illustrative embodiments, the deposition process 211 may be performed with temperatures of approximately 500° C. and less so as to not unduly affect temperature sensitive areas, such as the metal silicide regions 255.

Figure 2C:
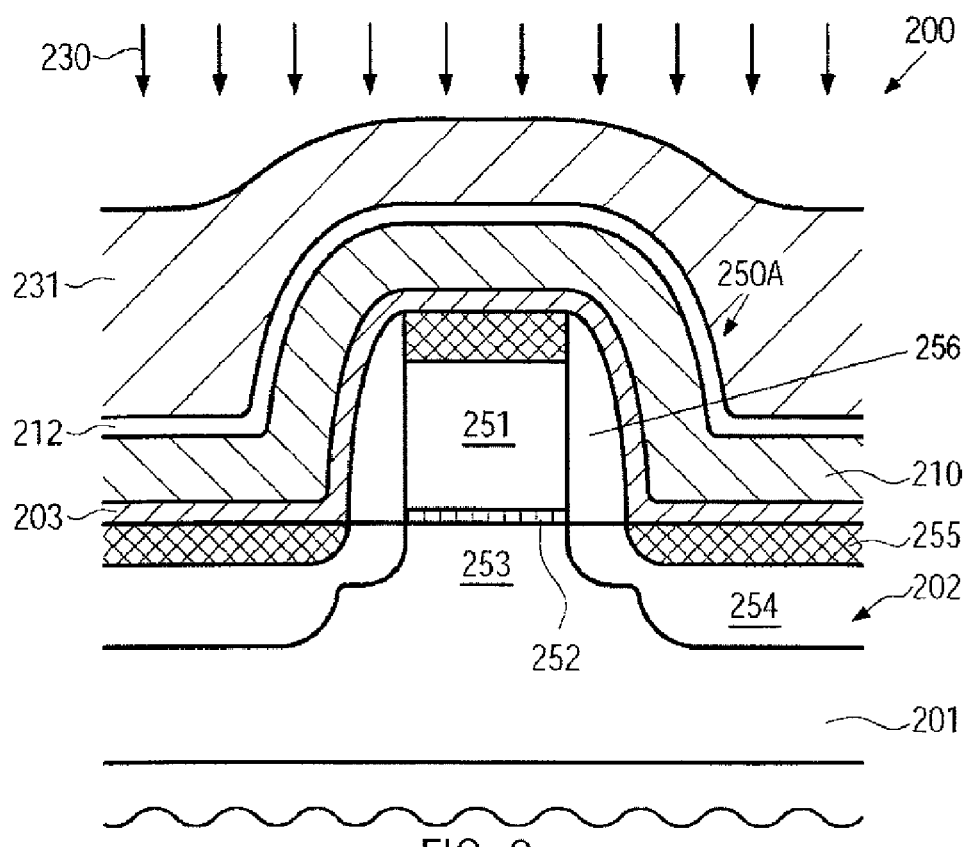

FIG. 2c schematically illustrates the transistor 250A in a further advanced manufacturing stage when the plasma assisted deposition process 230 is performed to obtain an interlayer dielectric material 231, wherein well-established process recipes may be used, as previously explained. For instance, a plasma assisted deposition process 230 may be performed on the basis of TEOS to provide the material 231 as a silicon dioxide material. Thereafter, the further processing may be continued by planarizing the surface topography, if required, wherein it may be appreciated that the surface topography may, in some illustrative embodiments, be reduced by the deposition of the buffer material 212 when the deposition process 211 may have a highly non-conformal deposition behavior, as may, for instance, be obtained on the basis of the sub-atmospheric thermally activated CVD process, which may be performed at moderately high pressures of approximately 200-760 Torr. During such deposition conditions, a substantially flow-like behavior with enhanced gap-filling capabilities may be accomplished. Consequently, the surface topography obtained after the deposition process 230 may be less pronounced compared to conventional strategies, thereby enhancing the overall surface planarity after the respective planarization process.

Figure 2D:
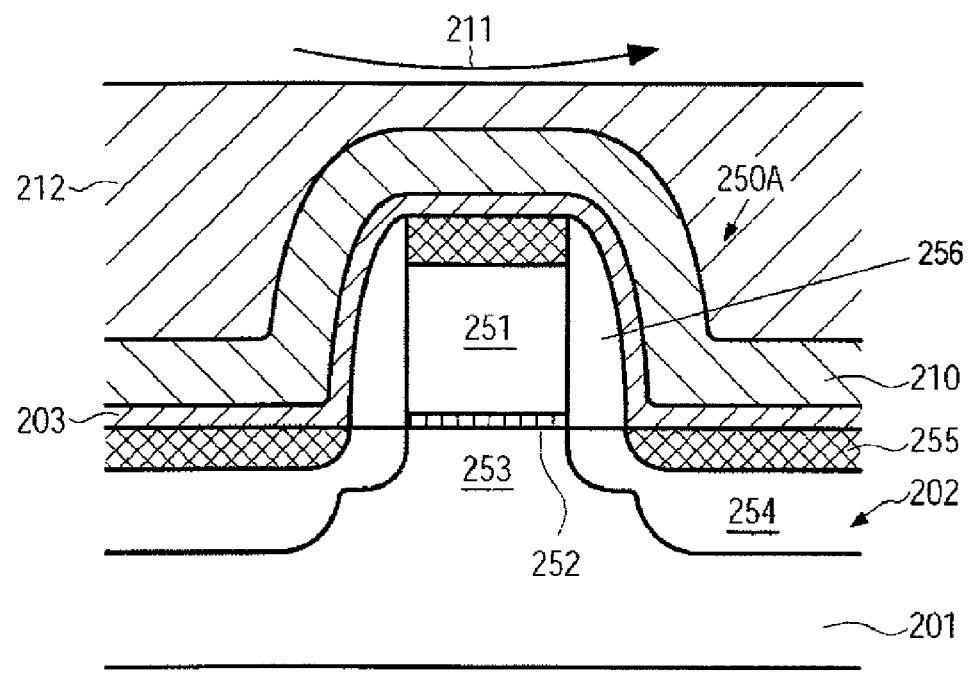
FIGS. 2d-2e schematically illustrate an N-channel transistor in various manufacturing stages for forming a tensile-stressed dielectric material followed by a dielectric buffer material formed by a spin-on technique, according to illustrative embodiments.

FIG. 2d schematically illustrates the transistor 250A according to still further illustrative embodiments, in which the non-plasma assisted deposition process 211 may be performed by a spin-coating technique, in which any appropriate material, for instance a polymer material, may be deposited in a low viscous state, thereby obtaining a highly non-conformal deposition behavior. It should be appreciated that the spin-coating process 211 may not necessarily result in a substantially planar surface topography, as shown in FIG. 2d, but may nevertheless exhibit a certain degree of non-planar surface topography, depending on the initial geometry defined by the transistor 250A. The buffer material 212 may be provided by any appropriate polymer material which may allow a subsequent treatment to harden the material, which may be accomplished on the basis of a heat treatment, radiation treatment and the like. After forming the buffer layer 212, the further processing may be continued by depositing the interlayer dielectric material 231 on the basis of the process 230, as described with reference to FIG. 2c.

Figure 2E:
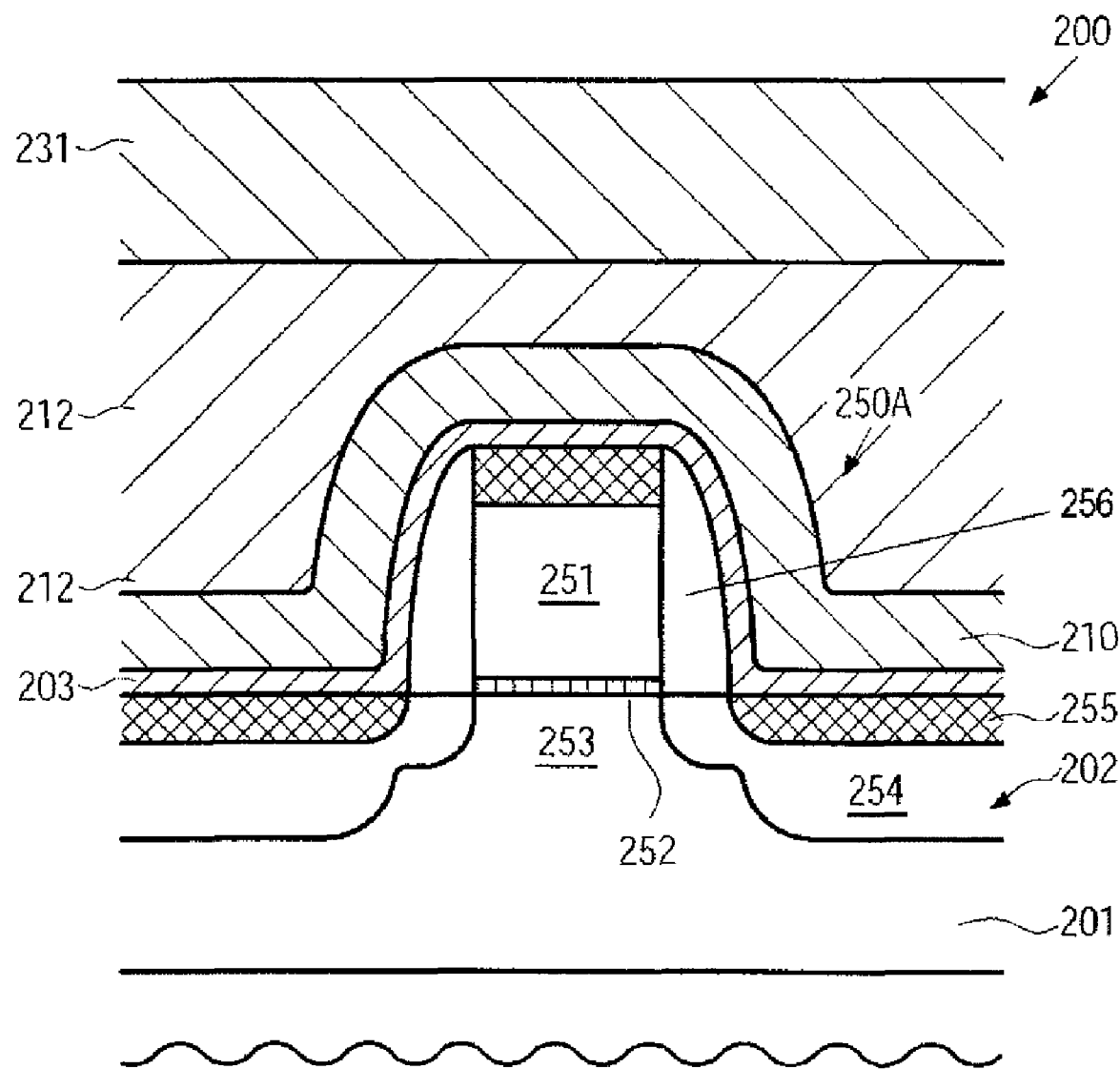

FIG. 2e schematically illustrates the transistor 250A with the layer 231, which may now be provided with a significantly reduced surface topography, thereby enhancing the overall process uniformity. During the further processing of the transistor 250A as shown in FIG. 2e, the buffer material 212 may be efficiently used as a first etch stop material when patterning the interlayer dielectric material 231, thereby enabling enhanced control of the patterning process.

It should be appreciated that during the deposition process 211 as shown in FIG. 2d, the resulting buffer material 212 may not necessarily need to cover the entire structure of the transistor 250A. That is, in some cases, an upper portion of the tensile-stressed layer 210 above the gate electrode structure 251 may remain exposed, which, however, may not significantly affect the overall stress-inducing effect of the layer 210, as long as horizontal portions and a part of the sidewall spacer structure 256 may remain covered by the buffer material 212. In some illustrative embodiments, the buffer material 212 may be provided with sufficient excess height so as to substantially completely enclose the transistor 250A and may be subsequently reduced, for instance, by chemical mechanical polishing, wherein the layer 210 at the top of the gate electrode structure 251 may act as an efficient CMP stop layer, thereby obtaining a well-defined height of the buffer material 212 with enhanced process uniformity.

With reference to FIGS. 3a-3e and 4a-4c, further illustrative embodiments will now be described in which various variations of the dual stress liner approach may be illustrated in combination with the provision of the stress relaxation reducing buffer material.

Figure 3A:
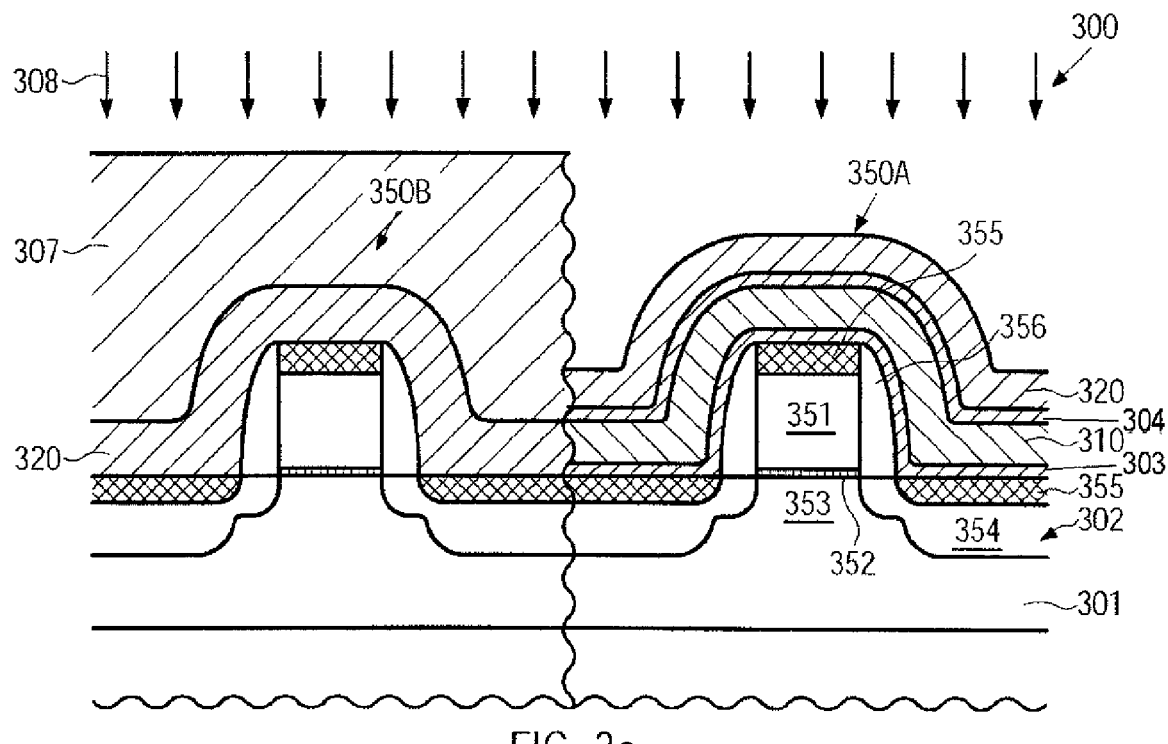
FIGS. 3a-3b schematically illustrate cross-sectional views according to a dual stress liner approach for forming a tensile-stressed layer first, in combination with providing a buffer material for reducing stress relaxation, according to illustrative embodiments.

FIG. 3a schematically illustrates a semiconductor device 300 comprising a substrate 301 and a semiconductor layer 302 in and above which transistors 350A, 350B may be provided in an advanced manufacturing stage. In one illustrative embodiment, the transistor 350A may represent an N-channel transistor while the transistor 350B may represent a P-channel transistor. The transistors 350A, 350B may comprise a gate electrode structure 351, a gate insulation layer 352, a channel region 353, drain and source regions 354, metal silicide regions 355 and a sidewall spacer structure 356. With respect to the components described so far, the same criteria apply as previously explained with reference to the device 100 and the transistor 250A. Furthermore, the transistor 350A may comprise an etch stop layer 303 followed by a tensile-stressed dielectric layer 310 and an etch control layer 304. Moreover, a compressively-stressed layer 320 may be formed above the transistor 350B and on the etch control layer 304. Furthermore, in the manufacturing stage shown, an etch mask 307 may be provided, for instance, in the form of a resist mask, in order to cover the transistor 350B while exposing the transistor 350A, i.e., the respective layers formed thereabove.

In one illustrative embodiment, the layers formed above the transistors 350A, 350B may be provided on the basis of a process sequence, as previously explained with reference to the device 100. Thus, based on the etch mask 307, an etch process 308 may be performed to remove the exposed portion of the layer 320 while controlling the etch process 308 on the basis of the etch control layer 304. Thereafter, any residues of this layer may be removed along with the etch mask 307, as is also previously described.

Figure 3B:
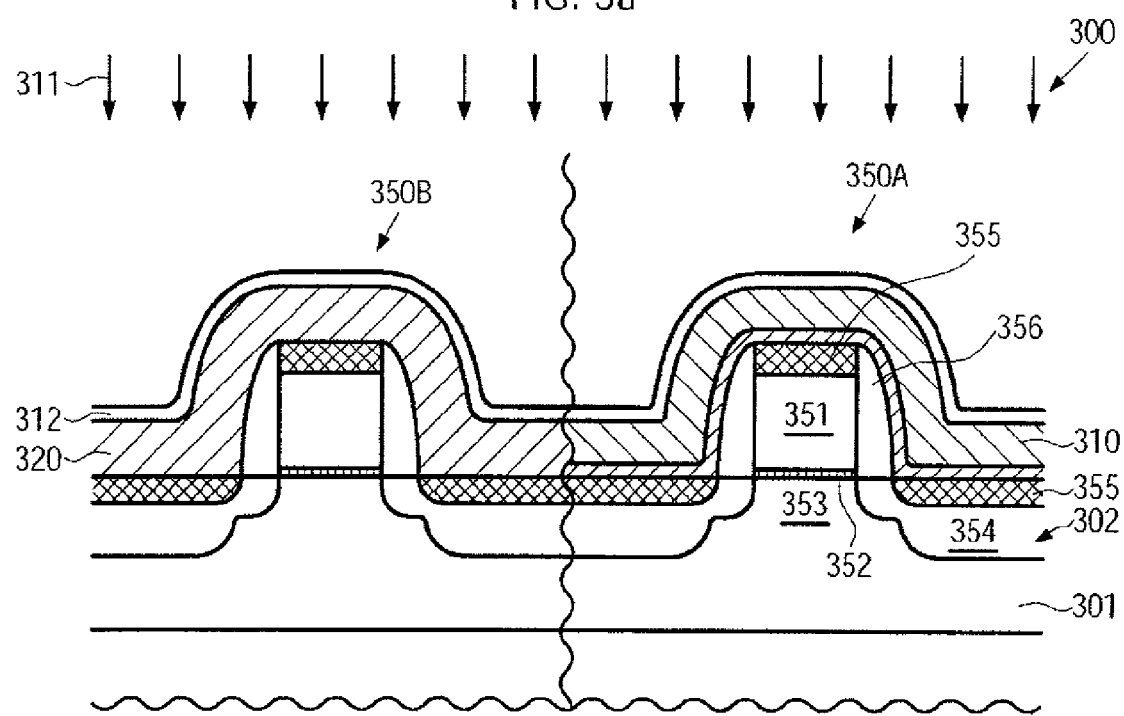

FIG. 3b schematically illustrates the semiconductor device 300 during a non-plasma assisted deposition process 311, which may represent a thermally activated CVD process. Thus, during the process 311, a buffer material 312 may be formed on the layers 320 and 310, substantially without introducing significant amounts of material into the layer 310, thereby also substantially avoiding significant stress relaxation. Consequently, during the further processing, an interlayer dielectric material, such as silicon dioxide, may be deposited on the basis of a plasma enhanced deposition technique, substantially without contributing to stress relaxation in the transistor 350A. After the deposition, the further processing may be continued by planarizing and patterning the respective interlayer dielectric material, as described above.

Figure 3C:
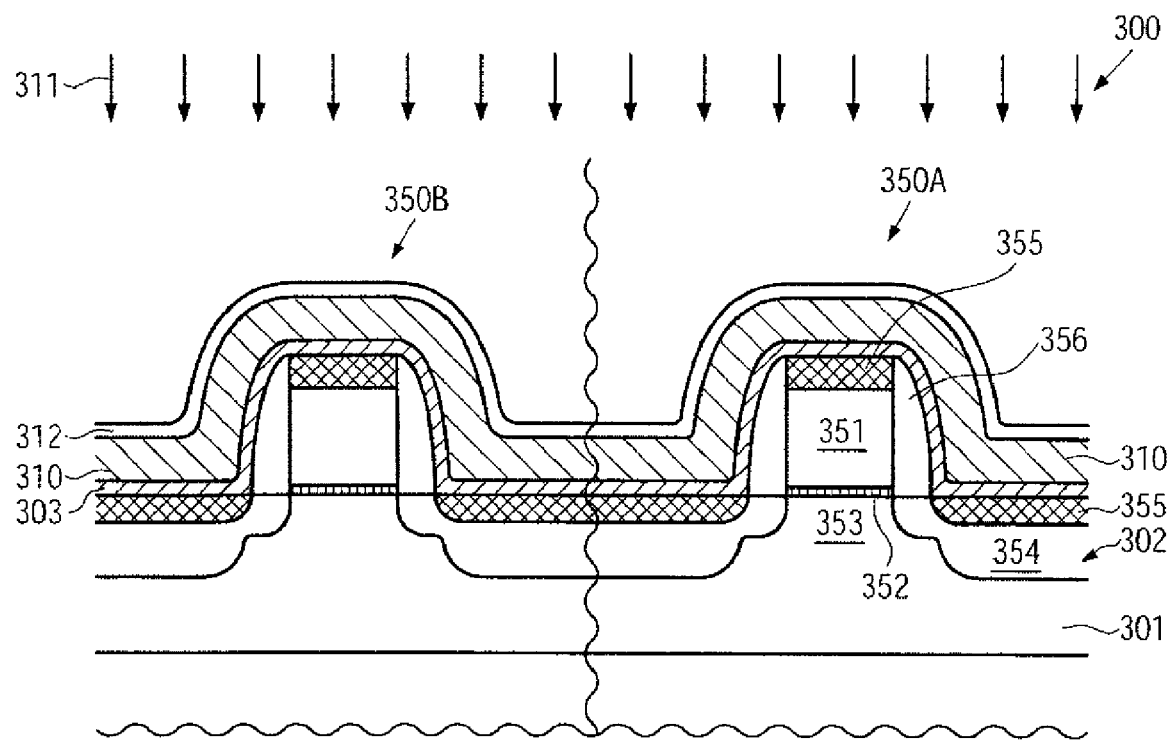
FIGS. 3c-3d schematically illustrate cross-sectional views of a dual stress liner approach in which the buffer layer for protecting against stress relaxation may be provided in an early manufacturing stage, according to still further illustrative embodiments.

FIG. 3c schematically illustrates the semiconductor device 300 according to further illustrative embodiments, in which the tensile-stressed dielectric layer 310 is formed above the transistors 350A, 350B, possibly in combination with the etch stop layer 303. As shown, the non-plasma assisted deposition process 311 may be performed to provide the buffer material 312 on the layer 310 in its non-patterned state. In one illustrative embodiment, the buffer material 312 may be formed, for instance, during a thermally activated CVD process with a sufficient thickness to act as an etch stop layer during a patterning process when removing unwanted portions of a compressively-stressed layer, as is, for instance, shown in FIG. 3a. For this purpose, the buffer material 312 may, for instance, be provided in the form of a silicon dioxide material with a sufficient thickness of approximately 10-30 nm, which may result in a sufficient layer thickness after the patterning process to control the etch process 308 (FIG. 3a). In other illustrative embodiments, the buffer material 312 may be provided in combination with an additional etch control or etch stop material that may be used for the etch process 308.

Figure 3D:
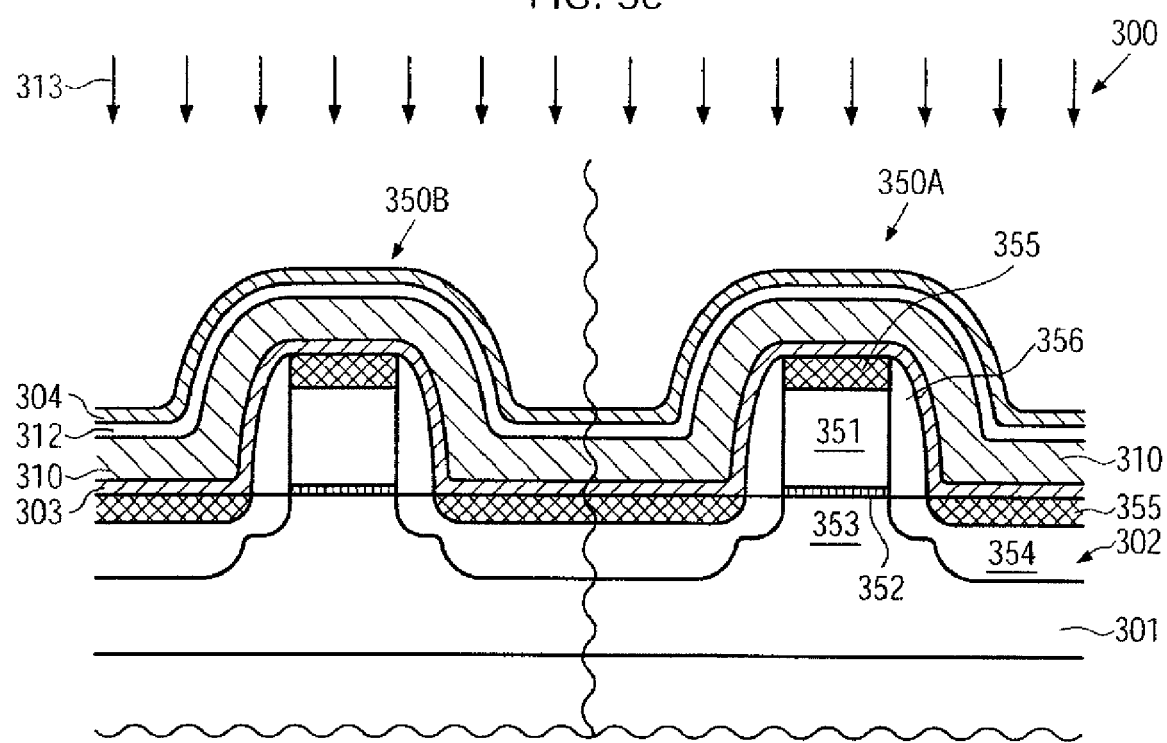

FIG. 3d schematically illustrates the semiconductor device 300 during a corresponding deposition process 313 for forming the etch control material or etch stop material 304. Since the buffer material 312 may substantially maintain integrity of the layer 310, any appropriate deposition technique may be used during the process 313, such as PECVD and the like. Thus, a variety of appropriate materials may be deposited as the etch stop or etch control material 304. For example, a polysilicon material may be deposited, which may provide a high etch selectivity during a subsequent etch process 308 (FIG. 3a) on the basis of an appropriate etch recipe, while, in other cases, the etch stop material 304 may be provided in the form of silicon dioxide, however, with a required density and thus with increased etch stop capabilities compared to the layer 312, since the process 313 may be performed with a high degree of freedom with respect to the process parameters involved. After the deposition of an etch stop or etch control layer 304, the further processing may be continued, as described above, that is, the layers 304, 312, 310 and possibly the layer 303 may be removed from the transistor 350B and subsequently the compressively-stressed dielectric layer 320 may be deposited and may then be removed from above the transistor 350A, as is shown in FIG. 3a.

Figure 3E:
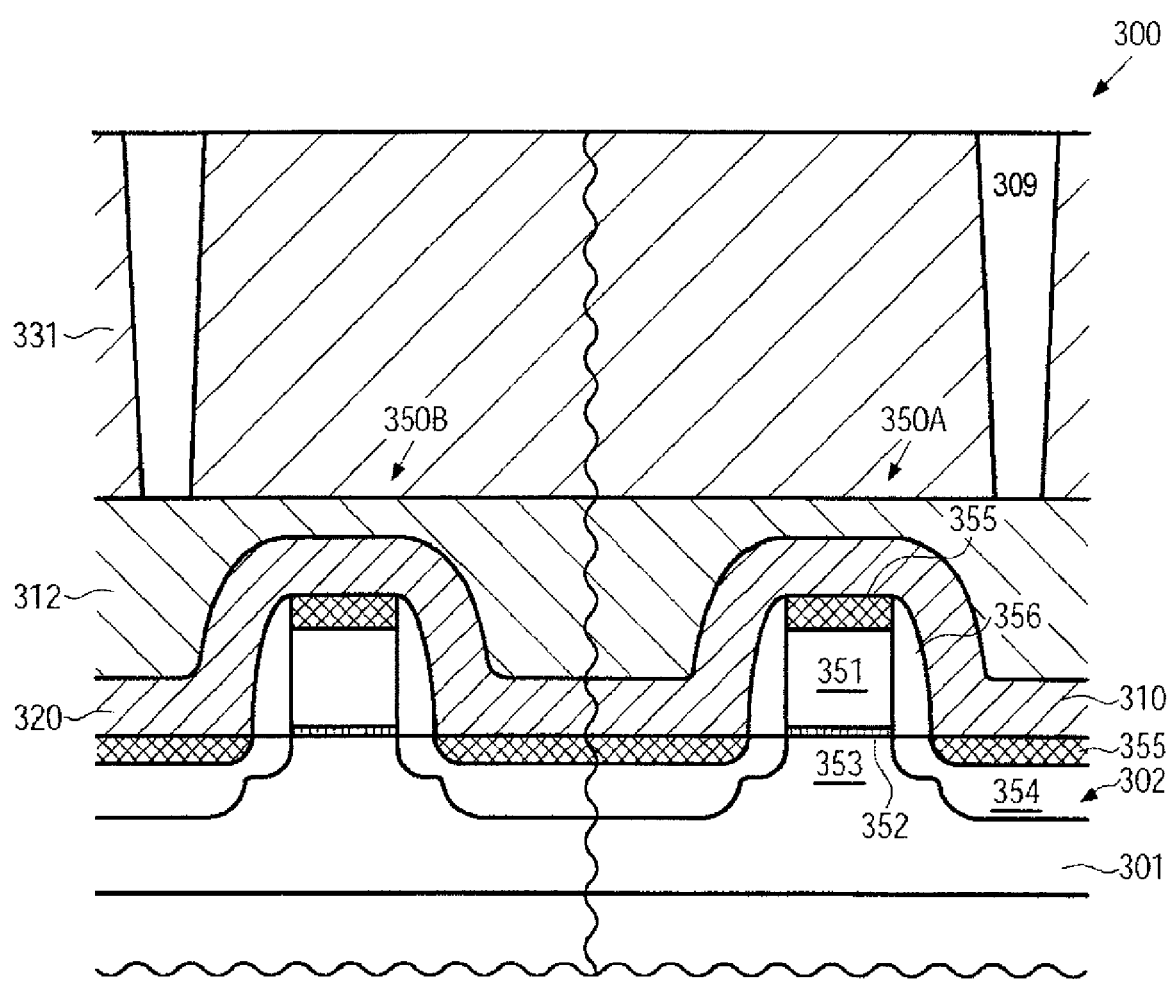
FIG. 3e schematically illustrates the semiconductor device comprising a buffer material between the highly stressed contact etch stop layers and a silicon dioxide-based interlayer dielectric material, wherein the buffer material is formed by spin coating in the form of a polymer material, according to still further illustrative embodiments.

FIG. 3e schematically illustrates the semiconductor device 300 according to further illustrative embodiments in which the non-plasma assisted deposition process 311 (FIG. 3b) may be performed by spin coating, thereby providing the buffer material 312 with a less pronounced surface topography, as also explained above. Moreover, as shown, the further processing may then be continued by forming the interlayer dielectric material 331 on the basis of a plasma assisted deposition process wherein, in the embodiment shown, the gap-filling capabilities of the respective deposition process may be less pronounced due to the enhanced surface topography provided by the buffer material 312. In other cases, as described with reference to FIGS. 3c-3d, substantially conventional deposition recipes may be used, if a high degree of compatibility with conventional dual stress liner approaches is desired. Thereafter, the interlayer dielectric material 331 may be planarized and respective openings 309 may be formed, wherein, in some illustrative embodiments, the buffer material 312 may act as an efficient intermediate etch stop layer. In other cases, the respective patterning process may be performed on the basis of an etch chemistry with low or no selectivity between the materials 331 and 312, while the layers 320 and 310 may act as efficient etch stop materials.

Figure 4A:
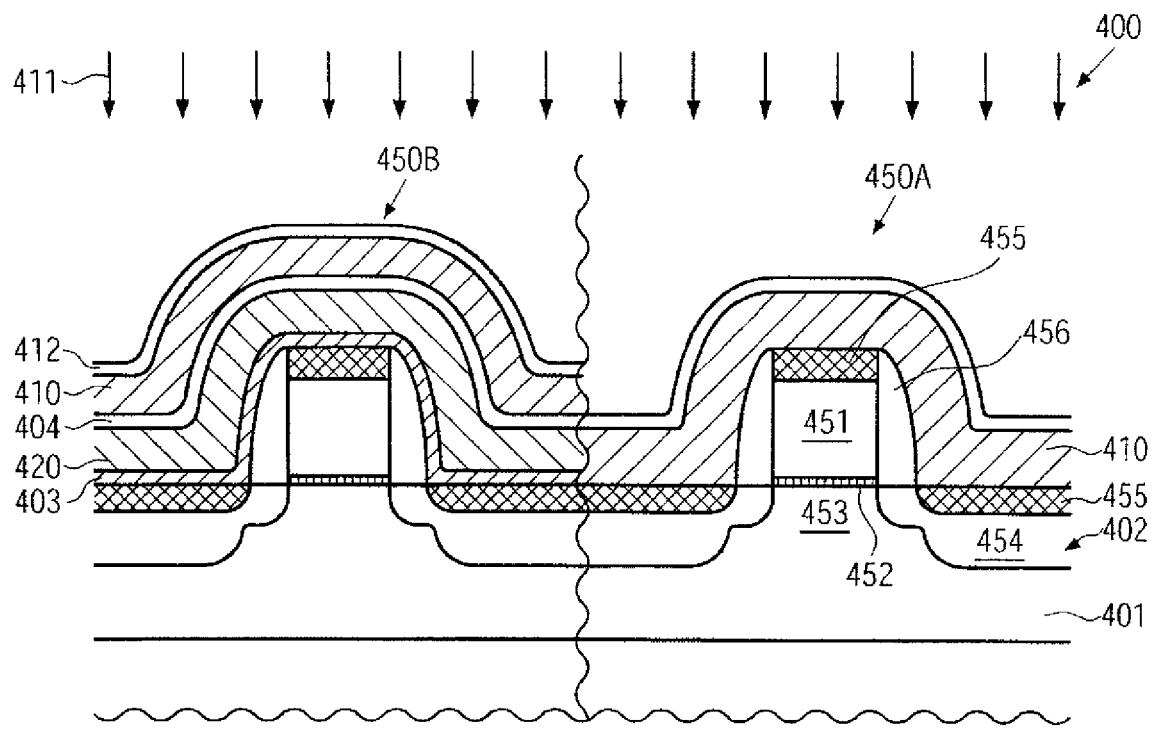
FIGS. 4a-4b schematically illustrate cross-sectional views of a semiconductor device during various manufacturing stages in a dual stress liner approach in which the compressively-stressed dielectric material is formed first and a tensile-stressed layer is provided in combination with a buffer material prior to patterning the tensile stressed layer, according to still further illustrative embodiments.

FIG. 4a schematically illustrates a semiconductor device 400 which comprises an N-channel transistor 450A and a P-channel transistor 450B. The transistors 450A, 450B may be formed in and above a semiconductor layer 402 provided above a substrate 401. Furthermore, the transistors 450A, 450B may have the same configuration as previously described with reference to the devices 100, 250A and 300, wherein respective components may be denoted by the same reference numbers except for the first digit, which is a "4" compared to a "1," "2" or "3." Hence, a further detailed description of these components will be omitted here. Furthermore, in the manufacturing stage shown, the semiconductor device 400 may comprise the etch stop layer 403 above the transistor 450B followed by the compressively-strained dielectric layer 420, on which may be formed the tensile-stressed layer 410. On the other hand, the transistor 450A may comprise the tensile-stressed layer 410. Furthermore, the buffer material 412 may be formed above the transistors 450A, 450B.

A typical process sequence for forming the device 400 may comprise the following processes. After forming the basic transistor structures, the etch stop layer 403 may be deposited and thereafter the compressively stressed layer 420 may be formed above the transistors 450A, 450B followed by the etch control layer 404, if required. Subsequently, the layers 404, 420, possibly in combination with the layer 403, may be removed from above the transistor 450A on the basis of a respective masking regime. Thereafter, the tensile-stressed layer 410 may be deposited and subsequently a non-plasma assisted deposition process, for instance, in the form of a thermally activated CVD process, may be performed, thereby depositing the buffer material 412, for instance in the form of a silicon dioxide material and the like. Next, an etch mask may be provided to cover the transistor 450A for removing the buffer material and the non-desired portion of the layer 410 from above the transistor 450B. Thereafter, the etch mask may be removed and an interlayer dielectric material may be deposited on the basis of a PECVD process. During this entire process sequence, the dielectric layer 410 may be covered by the buffer material 412 thereby reducing contact with particle bombardment, for instance, during respective etch processes, resist mask removal techniques and during the plasma enhanced deposition process. Consequently, any strain relaxing mechanism may be significantly suppressed.

Figure 4B:
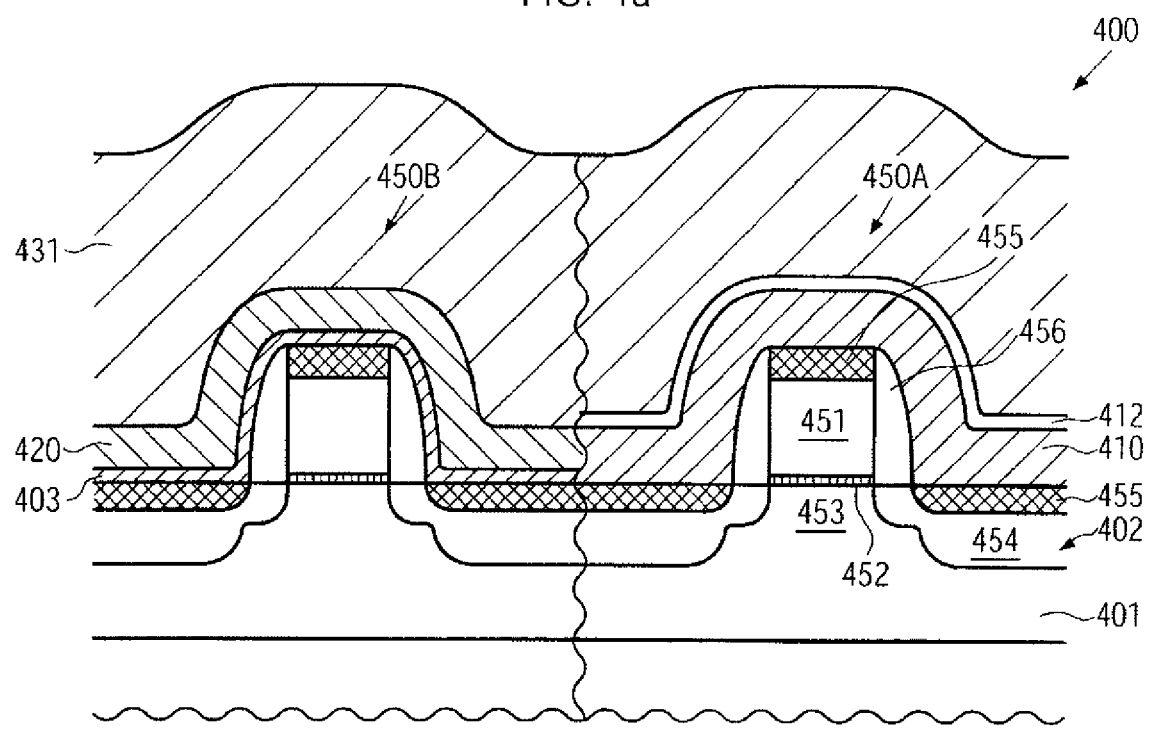

FIG. 4b schematically illustrates the semiconductor device 400 after the above-described process sequence. Hence, the interlayer dielectric material 431 may be formed above the transistors 450A, 450B with the buffer material 412 avoiding a direct contact of the layer 410 and the material 431.

Figure 4C:
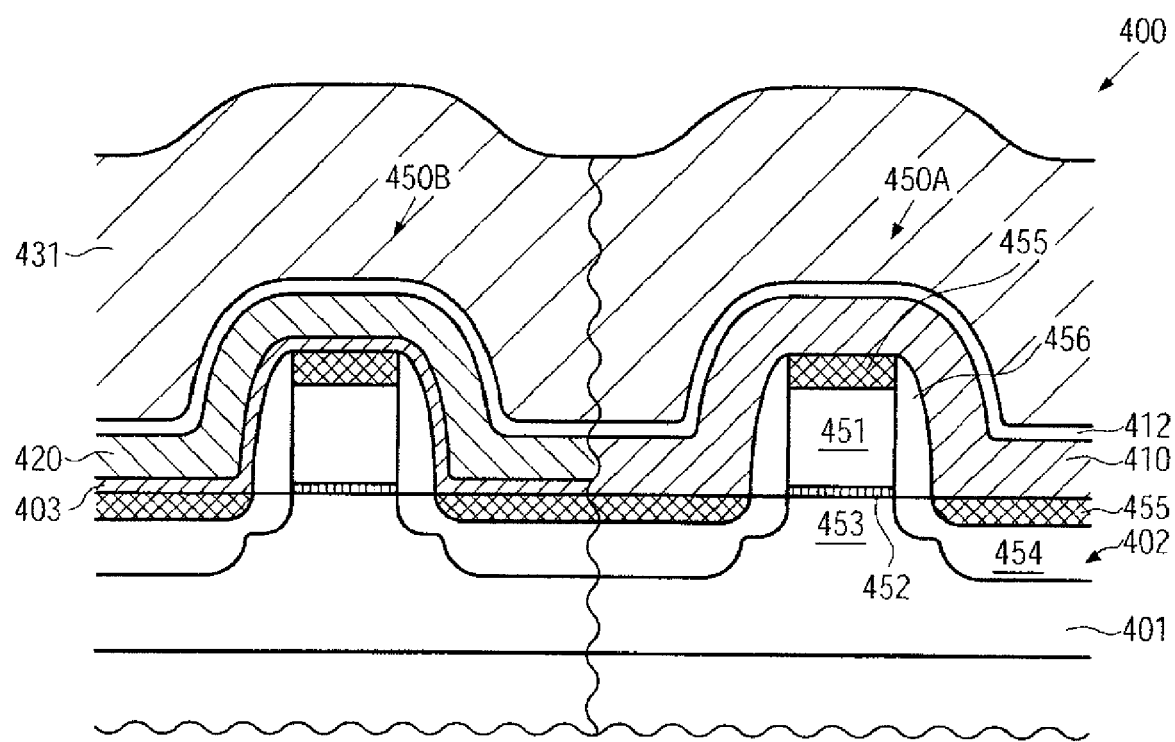
FIG. 4c schematically illustrates the semiconductor device according to a dual stress liner approach in which the buffer material may be formed immediately prior to the plasma enhanced deposition of the interlayer dielectric material, according to yet other illustrative embodiments.

FIG. 4c schematically illustrates the semiconductor device 400 according to a further illustrative embodiment in which the buffer material 412 may be formed above both transistors 450A, 450B. For this purpose, in the manufacturing stage as shown in FIG. 4a, the non-plasma assisted deposition process 411 may be performed after the removal of layer 410 from above the transistor 450B, thereby providing the material 412 to cover both transistors 450A, 450B, as shown in FIG. 4c. It should be appreciated that the buffer material 412 may also be formed on the basis of spin-on techniques, thereby reducing the overall surface topography of the device 400 as shown in FIG. 4c.

As a result, the subject matter disclosed herein provides enhanced dual stress liner techniques and respective semiconductor devices, wherein a tensile-stressed dielectric layer may be protected prior to performing a plasma enhanced deposition process to reduce the probability of stress relaxation in the tensile-stressed dielectric material. For this purpose, non-plasma assisted deposition techniques, such as thermally activated CVD, spin-on techniques and the like, may be used prior to actually forming an interlayer dielectric material on the basis of PECVD. Thus, a high degree of compatibility with conventional dual stress liner approaches may be achieved, wherein, in some illustrative embodiments, the respective buffer material may be formed in an early manufacturing stage, thereby providing enhanced integrity of the tensile-stressed dielectric material. In other cases, the compressively-stressed dielectric material may be provided first so as to not unduly expose the sensitive tensile-stressed dielectric material to particle bombardment during various etch and mask removal processes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first stress-inducing dielectric layer above a P-channel transistor and an N-channel transistor;
selectively removing a portion of said first stress-inducing layer from above said P-channel transistor;
forming a second stress-inducing dielectric layer above said P-channel transistor and said N-channel transistor;
selectively removing a portion of said second stress-inducing layer from above said N-channel transistor;
forming a dielectric buffer layer above said first stress-inducing dielectric layer by a non-plasma assisted first deposition process prior to selectively removing said portion of said first stress-inducing layer from above said P-channel transistor;
forming an etch control layer on said first stress inducing layer prior to forming said second stress inducing layer, and wherein selectively removing said portion of the second stress inducing layer comprises performing an etch process and using said etch control layer to determine an endpoint of said etch process; and
depositing an interlayer dielectric material by performing a plasma enhanced chemical vapor deposition process.

2. The method of claim 1, wherein said first stress-inducing layer is a tensile-stressed layer and is formed prior to forming said second stress-inducing layer.

3. The method of claim 2, further comprising forming an etch stop layer above said P-channel transistor and said N-channel transistor prior to forming said first stress-inducing layer.

4. The method of claim 1, wherein performing said non-plasma assisted deposition process comprises performing a thermally activated chemical vapor deposition process.

5. The method of claim 4, wherein said thermally activated chemical vapor deposition process is performed on the basis of TEOS (tetra ethyl orthosilicate) to deposit silicon dioxide.

6. The method of claim 1, wherein performing said non-plasma assisted deposition process comprises applying said dielectric buffer layer by spin coating.

7. The method of claim 1, further comprising forming a contact opening in the interlayer dielectric layer using at least one of said first or second stress-inducing layers and said dielectric buffer layer as etch stop materials.

* * * * *